United States Patent
Brosch et al.

(10) Patent No.: US 7,548,013 B2
(45) Date of Patent: Jun. 16, 2009

(54) HIGH TEMPERATURE PIEZO BUZZER

(75) Inventors: Jared Brosch, Cicero, IN (US); Grant Adam Morris, North Salem, IN (US)

(73) Assignee: Piezotech, LLC, Indianapolis, IN (US)

( * ) Notice: Subject to any disclaimer, the term of this patent is extended or adjusted under 35 U.S.C. 154(b) by 0 days.

(21) Appl. No.: 11/684,712

(22) Filed: Mar. 12, 2007

(65) Prior Publication Data

US 2007/0247028 A1 Oct. 25, 2007

Related U.S. Application Data

(60) Provisional application No. 60/782,185, filed on Mar. 14, 2006.

(51) Int. Cl.
*H02N 2/18* (2006.01)
(52) U.S. Cl. .................... 310/338; 310/358
(58) Field of Classification Search ............... 310/358; 501/134; 257/347
See application file for complete search history.

(56) References Cited

U.S. PATENT DOCUMENTS

| | | | |
|---|---|---|---|
| 5,317,305 A * | 5/1994 | Campman | 340/573.1 |
| 5,492,110 A | 2/1996 | Lenz et al. | |
| 5,757,273 A | 5/1998 | Crandall et al. | |
| 5,781,118 A | 7/1998 | Wise et al. | |
| 5,850,119 A * | 12/1998 | Ebara et al. | 310/321 |
| 6,091,331 A | 7/2000 | Toft et al. | |
| 6,645,586 B2 * | 11/2003 | Ohira et al. | 428/35.7 |
| 6,765,335 B2 * | 7/2004 | Wischnewskiy | 310/323.02 |
| 2004/0156737 A1 * | 8/2004 | Rakowski | 420/53 |
| 2005/0178997 A1 * | 8/2005 | Liufu | 252/62.9 PZ |
| 2006/0229187 A1 * | 10/2006 | Liufu | 501/134 |
| 2006/0255311 A1 * | 11/2006 | Liufu | 252/62.9 PZ |

FOREIGN PATENT DOCUMENTS

JP 08119733 * 5/1996

OTHER PUBLICATIONS

A JPO translation is provided for JP 08119733.*

* cited by examiner

*Primary Examiner*—Quyen P Leung
*Assistant Examiner*—Bryan P Gordon
(74) *Attorney, Agent, or Firm*—Woodard, Emhardt, Moriarty, McNett & Henry LLP

(57) ABSTRACT

A piezoelectric buzzer includes a vibrating layer capable of withstanding temperatures in excess of 260° C. for at least five minutes while still maintaining its ability to vibrate and produce a buzzing sound at a level of at least 80 dB, and a high temperature piezoelectric material having a Curie temperature in excess of 260° C. and one or more of the following properties: a planar coupling coefficient ($k_p$) of at least about 0.5; a longitudinal coupling coefficient ($k_{33}$) of at least about 1500; and a mechanical quality factor ($Q_m$) of at least about 2000. The piezo material may have a combination of these properties such that the product ($k_p^2$)($k_{33}$)($Q_m$) is at least about $1.5 \times 10^6$. The piezoelectric material may have a base formula of $Pb_xSr_{(1-x)}(Mn_{1/3}Sb_{2/3})_{(1-y)}(Zr_zTi_{1-z})_yO_3$ with x ranging from 0.95 to 0.99, y ranging from 0.92 to 0.97, and z ranging from 0.45 to 0.55, and may further include dopants in the amounts of about 0.4% $CeO_2$, about 1% CuO, and about 4% $Nb_2O_5$.

13 Claims, 1 Drawing Sheet

HIGH TEMPERATURE PIEZO BUZZER

REFERENCE TO RELATED APPLICATIONS

This application claims the benefit of U.S. Provisional Application Ser. No. 60/782,185, filed Mar. 14, 2006, the entire contents of which are hereby incorporated herein by reference.

FIELD OF THE INVENTION

The present invention relates generally to piezoelectric buzzers, and more particularly to piezoelectric buzzers that can be used in high-temperature environments.

BACKGROUND OF THE INVENTION

The use of piezoelectric buzzers in personal alert safety systems (PASS) is known. Such buzzers typically comprise a small, thin sheet of material that can be vibrated by a piezoelectric material powered by an alternating current to produce a loud buzzing sound. These buzzers are used, for example, by firefighters who wear the buzzers on their protective gear when entering a fire. When the firefighter is in trouble, such as when the firefighter is knocked to the ground, the buzzer will automatically emit a loud sound enabling others to locate and rescue the firefighter.

Certain disadvantages are known to exist with current PASS-type piezo buzzers. For example, known buzzers are typically made of brass and a soft, low Curie temperature PZT ceramic material. These buzzers are typically engineered to operate when exposed to temperatures of 175° F. for 25 minutes, and to produce a signal at a level of 95 dB or greater in the PASS unit.

In many fire situations, however, a firefighter is faced with temperatures far in excess of 175° F. In such situations, the piezo buzzers previously known may malfunction or even melt, so that the PASS protection is not provided.

A need therefore exists for piezoelectric buzzers capable of operating in a personal alert safety system even when exposed to temperature far in excess of 175° F. The present invention addresses that need.

SUMMARY OF THE INVENTION

Briefly describing one aspect of the present invention, there is provided a piezoelectric buzzer comprising a vibrating layer, a piezoelectric material overlaying the vibrating layer, and electrical connections for connecting the piezoelectric material to a power source.

The vibrating layer comprises a thin sheet of a material that is capable of withstanding temperatures in excess of 260° C. for at least five minutes while still maintaining its ability to vibrate and produce a buzzing sound at a sound pressure level of at least 80 dB (measured at 10 feet from the source; re 20 µPa), and preferably more than 95 dB when used in a PASS unit. Metals and high temperature polymers are generally preferred for the vibration layer.

The piezoelectric material is a piezoelectric ceramic having a Curie temperature in excess of 260° C. Preferably, the piezoelectric material will also have one or more of the following properties: a planar coupling coefficient ($k_p$) of at least about 0.5; a dielectric constant ($k_{33}$) of at least about 1500; and a mechanical quality factor ($Q_m$) of at least about 2000. More preferably, the piezo material will have a combination of these properties such that the product $(k_p^2)(k_{33})(Q_m)$ is at least about $10^5$, while still maintaining a Curie temperature in excess of 260° C., to ensure both high power (sound) output and proper functioning in high temperature environments.

In some preferred embodiments the piezoelectric material is a PZT ceramic material having a base formula of:

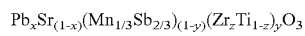

wherein x may range from 0.95 to 0.99;

wherein y may range from 0.92 to 0.97; and wherein z may range from 0.45 to 0.55.

In one preferred embodiment the piezoelectric material is a PZT ceramic material having a base formula of:

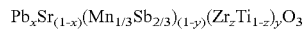

wherein x is about 0.96;

wherein y is about 0.94; and wherein z is about 0.5.

One or more dopants may be included in the piezo ceramic material. Preferred dopants may be selected from the group consisting of: $CeO_2$, $CuO$, $PbO$, $SnO_2$, $Sm_2O_3$, $TeO_2$, $MoO_3$, $Nb_2O_5$, $SiO_2$, $CdO$, $HfO_2$, $Pr_2O_3$, and mixtures thereof. The dopants are preferably added to the ceramic composition in individual amounts ranging from 0.01 wt % to up to 5.0 wt %.

In one preferred embodiment the piezoelectric material is a PZT ceramic material having a base formula of:

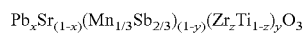

wherein x is about 0.96;

wherein y is about 0.94; and wherein z is about 0.5; and wherein the material further includes dopants in the amounts of:

$CeO_2$ is about 0.4%;

$CuO$ is about 1%; and $Nb_2O_5$ is about 4%.

DESCRIPTION OF THE PREFERRED EMBODIMENTS

Figure 1:
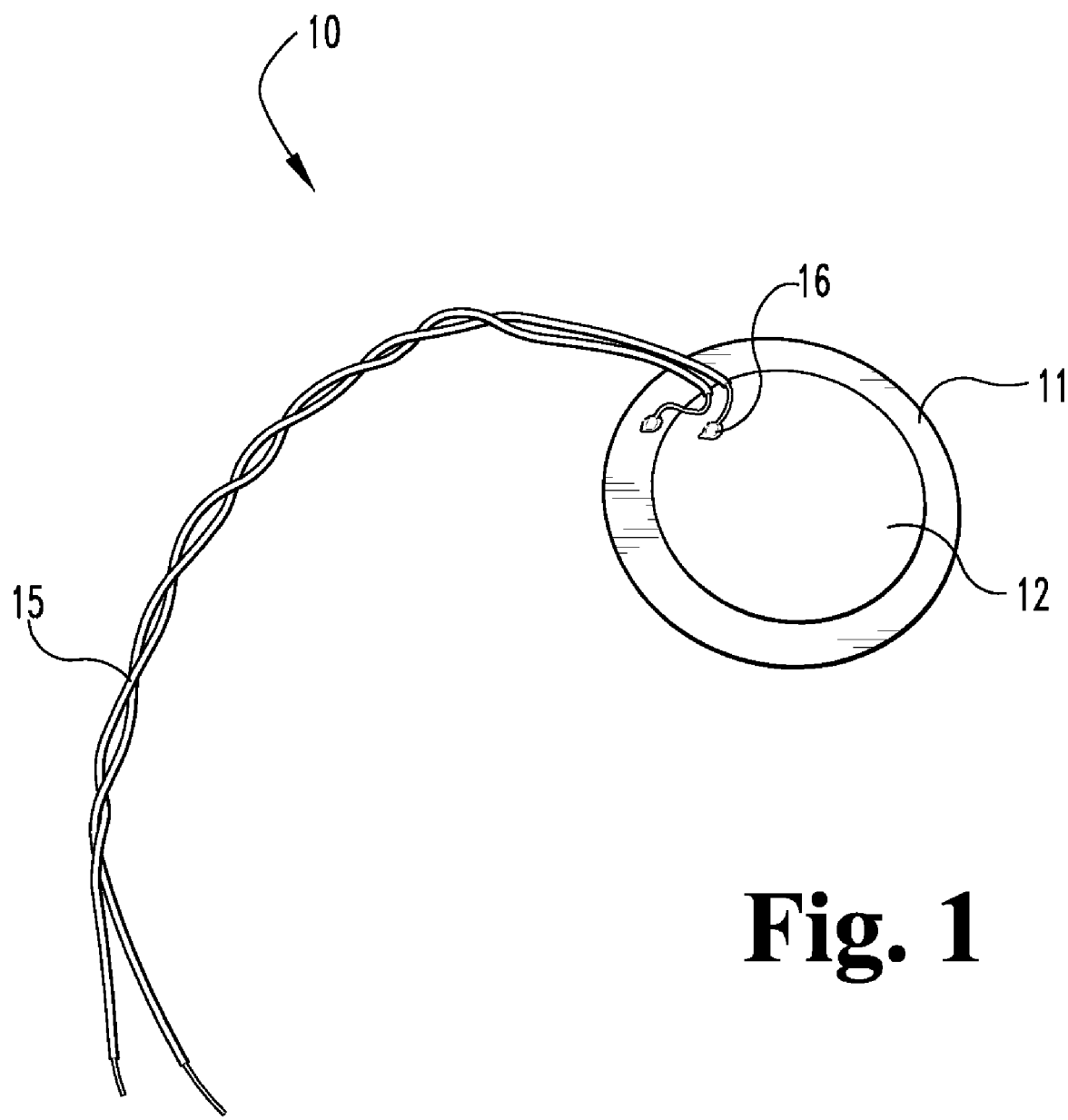
FIG. 1 is a perspective view of the piezo buzzer of the present invention, according to one preferred embodiment.

For the purposes of promoting an understanding of the principles of the invention, reference will now be made to certain embodiments and specific language will be used to describe the same. It will nevertheless be understood that no limitation of the scope of the invention is thereby intended, such alterations and further modifications of the illustrated embodiments being contemplated as would normally occur to one skilled in the art to which the invention relates.

As indicated above, the piezoelectric buzzer (alternatively described as a piezoelectric annunciator or a piezoelectric transducer) of the present invention comprises a vibrating layer, a piezoelectric material overlaying the vibrating layer, and electrical connections for connecting the piezoelectric material to a power source.

The vibrating layer may be a thin metal layer, or it may be made of a polymer or other material. In all cases the vibrating layer must be capable of withstanding temperatures in excess of 260° C. for at least five minutes while still maintaining its ability to vibrate and produce a buzzing sound at a sound pressure level of at least 80 dB (measured at 10 feet from the source; re 20 μPa), and preferably more than 95 dB, when used in a PASS unit.

In one preferred embodiment the vibrating layer is made of Kovar (an iron-nickel-cobalt alloy) with a coefficient of linear thermal expansion of $5.15 \times 10^{-6}/°$ C. under 260° C. In other embodiments the vibrating layer is made of Invar (an iron-nickel alloy) with a coefficient of thermal expansion (CTE) $\sim 1.5\text{-}2.0 \times 10^{-6}/°$ C., or Inconel (a family of austenitic nickel-based superalloys) having a CTE $\sim 7 \times 10^{-6}/°$ C., or molybdenum (CTE $\sim 5.5 \times 10^{-6}/°$ C.). Nickel-based alloys such as alloy 42 and/or alloy 59 may also be used, as may titanium or titanium alloys, ferritic stainless steels, and other proprietary iron alloys. In other embodiments the vibrating material may be made from high temperature plastics such as modified polyketones, certain polyimides and/or polyamide-imides, aromatic sulphones, etc. Additionally or alternatively, ceramics, silicones, silicone carbides, silicone nitrides, tungsten-based materials, zirconium-based materials, graphite-based materials, fiber reinforced plastics, etc., may be used.

The vibrating layer is typically provided as a thin sheet with a thickness of between 0.1 and 1.0 mm, most preferably about 0.25 mm. Most commonly, the vibrating layer is a round sheet with a diameter of between 10 mm and 40 mm, most preferably between 25 and 30 mm, although different sizes may be appropriate depending on the requirements of a particular PASS device.

The piezoelectric material has a Curie temperature in excess of 260° C., more preferably in excess of 300° C., and most preferably in excess of 320° C. Preferably, the piezoelectric material will also exhibit suitable electromechanical properties for use in high power applications. For example, the piezoelectric material will preferably exhibit one or more of the following electromechanical properties: a free dielectric constant ($K^T_{33}$) of between about 1200 and 2000 (preferably between about 1350 and about 1650, and most preferably at least about 1500), a mechanical Q (thickness) of between about 400 and about 1000 (preferably at least about 670), a mechanical Q (radial) of between about 1500 and 2800 (most preferably at least about 2000); a piezoelectric strain constant ($d_{33}$) of between about 250 and 450 pC/N (more preferably between about 290 and about 350, most preferably about 320 pC/N), a dielectric loss/dissipation factor (D) of between 0.002 and 0.008 (most preferably less than about 0.004), a thickness electromechanical coupling coefficient ($k_t$) of between 0.45 and 0.7 (most preferably between about 0.475 and about 0.530), a planar coupling coefficient ($k_p$) of at least about 0.3 (more preferably at least about 0.5, most preferably between about 0.58 and about 0.65); a longitudinal coupling coefficient ($k_{33}$) of at least about 0.7, a transverse coupling coefficient ($k_{31}$) of at least about 0.27 (more preferably between about 0.24 and about 0.3), and a Curie temperature of between about 315° C. and about 325° C.

More preferably, the piezo material will have a combination of properties such that the product of the planar coupling coefficient ($k_p^2$), the free dielectric constant ($K^T_{33}$), and the mechanical Q ($Q_m$(radial)) value is maximized. In particular, it is desired that the product $(k_p^2)(K^T_{33})(Q_m(radial))$ is at least about $10^5$, more preferably at least about $5 \times 10^5$, and most preferably at least about $10^6$. When provided by a material having a Curie temperature in excess of 260° C., and more preferably by a material having a Curie temperature in excess of 300° C., this combination will help ensure both high power (sound) output and proper functioning in high temperature environments.

In some preferred embodiments the piezoelectric material is a PZT ceramic material having a base formula of:

$$Pb_xSr_{(1-x)}(Mn_{1/3}Sb_{2/3})_{(1-y)}(Zr_zTi_{1-z})_yO_3$$

wherein x may range from 0.95 to 0.99;

wherein y may range from 0.92 to 0.97; and wherein z may range from 0.45 to 0.55.

In one preferred embodiment the piezoelectric material is a PZT ceramic material having a base formula of:

$$Pb_xSr_{(1-x)}(Mn_{1/3}Sb_{2/3})_{(1-y)}(Zr_zTi_{1-z})_yO_3$$

wherein x is about 0.96;

wherein y is about 0.94; and wherein z is about 0.5.

One or more dopants may be included in the piezo ceramic material. Preferably, the dopant(s) are included in the material by incorporating into the pre-fired composition one or more dopant precursor materials selected from the group consisting of: $CeO_2$, $CuO$, $PbO$, $SnO_2$, $Sm_2O_3$, $TeO_2$, $MoO_3$, $Nb_2O_5$, $SiO_2$, $CdO$, $HfO_2$, $Pr_2O_3$, and mixtures thereof. These dopant precursors are preferably added to the ceramic composition in individual amounts ranging from 0.01 wt % to up to 5.0 wt %.

In one preferred embodiment the piezoelectric material is a PZT ceramic material having a base formula of:

$$Pb_xSr_{(1-x)}(Mn_{1/3}Sb_{2/3})_{(1-y)}(Zr_zTi_{1-z})_yO_3$$

wherein x is about 0.96;

wherein y is about 0.94; and wherein z is about 0.5; and wherein the material further includes dopants in the amounts of:

$CeO_2$ is about 0.4%;

$CuO$ is about 1%; and $Nb_2O_5$ is about 4%.

In one embodiment the piezoelectric material is a PZT ceramic made as described herein from the following relative amounts of starting materials: $Pb_{0.96}Sr_{0.0194}Mn_{0.016}$-$Sb_{0.032}Zr_{0.466}Ti_{0.456}Nb_{0.038}Cu_{0.010}Ce_{0.004}$.

The piezoelectric ceramic compositions used in the present invention preferably have a composite perovskite crystal structure. In some preferred embodiments, the composite perovskite ceramic provides a unique crystal structure as a single-phase ceramic composition. The term "composite perovskite crystal structure," is intended to encompass ceramic compositions exhibiting a unique crystal structure prepared by combining the selected elements in a unique, stoichiometric ratio. In this structure, each element or type of element is located at a crystallographically predictable or determinable site, typically a lattice site within the crystal structure. Consequently, the piezoelectric ceramic materials preferably used in the present invention do not exhibit the same properties normally exhibited by a solid solution of metals, or metal oxides, in a ceramic matrix. Similarly, the preferred piezoelectric ceramic materials may exist as a composite perovskite crystal structure with one or more added dopants which may be located in the interstitial sites of the crystal lattice.

In the most preferred embodiments of the present invention the perovskite ceramics used to drive the vibrating material have a Curie temperature value of between about 260° C. and about 350° C.

The piezoelectric ceramics used in the present invention may be prepared by slurrying the selected powdered metal precursors in a liquid such as water or an alcohol. The suspended powder may be pulverized in a ball mill until the mixed slurry is homogeneous and has a sufficiently small particle size. The resulting pulverized mixture may be dried, preferably in an oven at elevated temperatures between about 100 and 150° C.

The resulting powder may be thermally treated at temperatures of up to 1000° C. (or more, in some cases), or calcined, to form the desired perovskite structure. The powder is slowly heated to the selected temperature over a period of time. The heating rate can be varied considering the powder mass, the components in the powder, and the desired application for the final piezoceramic component.

Thereafter, the powder may be held at the selected temperature for several hours. Again, the time period or hold time can be varied depending on the mass, identity, and amount of the components in the powder. Typically the powder is held at the selected temperature for a hold time between 1 and 10 hours, more preferably between 2 and 5 hours, and most preferably for about 3 hours. After this thermal treatment, the powder is allowed to cool to room temperature.

The calcined powder may be re-pulverized in a ball mill as has been described above and then dried. This re-pulverized ceramic may then be blended with a binder to provide a paste with the pulverized ceramic suspended in the paste. Preferred binders would include polyvinyl alcohol (PVA).

The ceramic/binder paste may be molded, pressed, or extruded as desired into a shaped article, alternatively referred to herein as a green article. For example, the shaped article may be molded into the shape of a generally parallel piped block or a round disk or any other desired shape.

The binder may be removed from the article either by heating to evaporate the binder, heating to a higher temperature to decompose the binder or, more preferably, by using a solvent to dissolve the binder material. The solvent can be any desired solvent, preferably an organic solvent, into which the binder material exhibits a suitably high solubility. Typical solvents include water, alcohols, acetone, chloroform, methylene chloride, and other polar organic solvents that exhibit a relatively low boiling point or high vapor pressure. A preferred binder/solvent combination is polyvinyl alcohol (PVA) dissolved in water.

The green article may then be sintered or fired at an elevated temperature range. The green article may be placed in a suitable container such as an alumina crucible and additional (unmolded) ceramic powder is placed around the shaped article during the firing process. The elevated temperature range can be selected to be between 900° C. and 1350° C., more preferably between about 1000° C. and 1300° C. and most preferably between 1200° C. and 1290° C. The article can be held at one or more selected temperatures within that temperature range for a time between about 10 and about 25 hours. More preferably, the article is slowly heated through the elevated temperature range at a selected heating rate. The heating rate can be selected by considering the mass or volume of the green article, the constituents in the ceramic, and the desired properties of the piezoceramic article. After the firing process, the article comprising the ferroelectric ceramic can be cooled to ambient temperature.

The ceramic article comprising the ferroelectric ceramic may then be poled at about 70 to about 80 V per mil thickness of the article. In one embodiment, the ceramic temperature during poling is selected to be between 100° C. and 140° C.

It is to be appreciated that the electrode deposition and poling can be performed differently than that in the above described in connection with other processes. For example, poling electrode deposition on the ceramic article can be accomplished by sputtering or screen printing processes. Typically, the electrodes are deposited on the opposing faces of the article. In one form, the electrode metallization includes low temperature sputtering of gold or an alloy thereof; however, other deposition processes and/or materials suitable for electrode formation can be utilized in different embodiments.

The ceramic of the article is poled (polarized). Polarization can be accomplished by subjecting the ceramic article to the following regime: (a) a slow ramp-up to an elevated temperature, (b) a slow ramp-up of a polarizing electric field (voltage) across the electrodes while maintaining the elevated temperature, (c) a slow ramp-down to room temperature while the field is maintained, and (d) a slow ramp down of the electric field while at room temperature. Temperature changes are performed at a rate of about 10° C. to 100° C. per minute and voltage changes are gradual to a maximum of about 50-80 volts per mil thickness of material with a dwell time at maximum temperature and voltage of about 5 minutes. Performance parameters of the piezoelectric ceramic are tested after poling. If desired at this stage, or at another stage of the process, the poling electrodes can be removed.

The resulting piezoelectric ceramic can be further processed as desired. In one form, the piezoelectric ceramic is used as a monolithic ceramic or billet for a particular device. Electrodes can be patterned on monolithic ceramic to provide a single piezoelectric element. In other embodiments, two, three, or more piezoelectric ceramic articles can be combined or laminated together. Each of the laminates typically contains separate electrodes. The laminate elements can be used to form a device such as actuators or projectors. In yet other embodiments, the piezoelectric ceramic can either be cut into a number of smaller units or combined with a number of different piezoelectric ceramics that either have the same or different electromechanical properties. Electrodes can be patterned on each of the smaller units or different piezoelectric ceramics, which can be combined to form a multi-element array.

In any of these applications, electrodes are deposited on the piezoelectric ceramic positioned and sized for the particular use of the resulting electronic device.

It is to be appreciated that when selecting materials for use in the present invention it is important to consider the thermal expansion of the components. For example, the brass used as the vibrating material in some known buzzers has a coefficient of linear thermal expansion of about $19 \times 10^{-6}/°$ C. Similarly, the piezoelectric material used in those known buzzers typically has a coefficient of linear thermal expansion of approximately $3.5 \times 10^{-6}/°$ C. Therefore, when these known buzzers experience a change in temperature as might be experienced during a fire (e.g., a change from room temperature to 260° C.), a difference in linear expansion of approximately 0.0045" occurs. This difference is typically larger than the thickness of the bonding material between the two surfaces (e.g., 0.0005") and may be substantial enough to create a delamination of the device.

Accordingly, it is preferable to select a piezoelectric material and a vibration material with compatible coefficients of linear thermal expansion so that the two materials do not delaminate when exposed to high temperatures. In one aspect of the present invention it is preferred to select a piezoelectric material with a coefficient of linear thermal expansion of between about $1 \times 10^{-6}/°$ C. and $9 \times 10^{-6}/°$ C. under 260° C., and to select a vibration material with a coefficient of linear thermal expansion of between about $1 \times 10^{-6}/°$ C. and about $9\times10^{-6}/°$ C. under 260° C., to ensure that the two material do not delaminate when exposed to high temperatures.

Alternatively, it is preferred that the difference in thermal expansion between the crystal and the metal diaphragm should be less than the typical bondline. Since the bondline for these devices is on the order of 0.002", the difference in thermal expansion between the crystal and the metal diaphragm should be less than that.

It is to be appreciated that as a general rule it is not preferred to increase the thickness of the bonding epoxy to compensate for the expansion difference. The disadvantage to increasing the thickness of the bonding material is that may decrease the mechanical Q of the device and will "dampen" the output sound levels.

In another aspect of the present invention a high melting temperature solder is used to fix the electric leads to the buzzer. Solders found on previously known buzzers (for example, SN60, SN62, and SN96) have had been high-tin solders with liquidus temperatures less than 220° C. In contrast, high melting temperature solders with liquidus temperatures above 260° C. are preferred for the present invention. Such solders include (but are not limited to) tin-lead combinations with at least 90% lead, tin-lead-antimony solders, cadmium-zinc solders, tin-silver solders, zinc-aluminum solders, tin-antimony solders, indium solders, lead-silver solders, tin-zinc solders, and fusible alloys.

In another aspect of the present invention a high melting temperature bonding epoxy is used to fix the piezoelectric material to the vibrating layer. In particular, an epoxy that has a glass transition temperature of more than 260° C. is preferred for the present invention.

In another aspect of the present invention a bonding epoxy having a coefficient of thermal expansion (CTE) that is compatible with the CTE of the piezoelectric material and with the CTE of the vibrating material is preferred. While normally the CTE of the epoxy will be much higher than the CTE of the metal or the piezo, choosing an epoxy with a low CTE will help reduce movement. Epoxies that may preferably be used in the present invention include: polyimide based epoxies, epoxy-Novolac based resins, glass bonding, soldering, and potentially brazing. An epoxy-Novolac based resin system is most preferred in testing to date.

It is to be appreciated that the piezo buzzers of the present invention will typically be powered by an external source of electric power. In some preferred embodiments the buzzer will be powered by 1 to 5 watts of AC current, most preferably about 3 watts. Other embodiments may use lower power sources providing only milliwatts of power, or higher power sources providing up to about 100 watts of power.

The electric leads used in the present invention are preferably Ni- or Ag-plated copper wire. In some embodiments the wire may be insulated, such as with a Teflon, polyimide, or FEP fluorothermoplastic jacket.

In some embodiments the buzzer may be a "bimorph" construction with two layers of piezoelectric material and one layer of vibrating material. In other embodiments, including the embodiment illustrated below, the buzzer may be a "unimorph" construction with one layer of piezoelectric material and one layer of vibrating material.

When multiple layers of piezoelectric material are used, the construction may be stacked or sandwiched. The layers may be aligned in series or in parallel.

Finally, it is to be appreciated that the diameter, thickness and mechanical properties of the vibrating plate and piezo disk are typically selected so that the buzzer will have a primary resonant frequency somewhere in the range of 500 Hz to 20 Khz. More preferably a primary resonant frequency of between 2 Khz and 4 Khz is provided.

Referring now to the drawings, FIG. 1 shows a piezoelectric buzzer according to one preferred embodiment. Buzzer 10 includes a vibrating layer 11 and a piezoelectric material 12. Electrical leads 15 are fixed to the buzzer with a high temperature solder 16.

Reference will now be made to specific examples using the processes described above. It is to be understood that the examples are provided to more completely describe preferred embodiments, and that no limitation to the scope of the invention is intended thereby.

EXAMPLE 1

Preparation of a Piezo Ceramic Material

The following powdered ceramics are combined: PbO, 683.7 g; $ZrO_2$, 183.3 g; $TiO_2$, 116.2 g; $Sb_2O_3$, 14.96 g; MnO, 4.46 g; $SrCO_3$, 9.17 g; $CeO_2$, 2.0 g; $Nb_2O_5$, 16.0 g; and CuO 2.5 g. This combination of powders includes 1 wt % PbO, 0.2 wt % $CeO_2$, 0.25 wt % CuO and 1.6 wt % $Nb_2O_5$ as dopant precursors.

The powders are suspended in 900 ml of deionized water and ball milled for about 16 hours. The resulting powdered slurry is then dried at 130° C. The dried powder is calcined at 950° C. for 3 hours. Thereafter the calcined ceramic powder is cooled to ambient temperature. The resulting ceramic is then re-pulverized by suspending in 700 ml of deionized water and is ball milled for 8 hours. The pulverized ceramic is again dried at 130° C. to evaporate the water. The dried powder is mixed with a 5% polyvinyl alcohol (PVA) solution (in water) to provide a paste. This paste is extruded through a 1.115" slotted die under 1000 lb force and "bisqued" to form a ceramic billet. This ceramic billet is fired at 1290° C. for 2.5 hours to produce the ferroelectric ceramic. Thereafter the ceramic billet is cooled to ambient temperature.

Silver electrodes were patterned on the ceramic billet according to standard procedures. The resulting billet is then poled (polarized) at 100° C.-140° C. and 70-80 V/mil for about 10 minutes. Representative electromechanical properties of the resulting piezoelectric ceramic are listed below.

| Density $\rho$ g/ml | Relative Dielectric Constant $\epsilon$ (F/m) | Mechanical Quality Factor $Q_m$ | Piezoelectric Strain Constant $d_{33}$ (pC/N) | Dielectric Loss Factor D | Coupling Constant $K_t$ | Planar Coupling Constant $K_p$ |
|---|---|---|---|---|---|---|
| 7.8 | 1494 | 1985 | 317 | 0.002 | 0.49 | 0.58 |

EXAMPLE 2

Fabrication of a High Temperature Piezo Buzzer

A piezo annunciator that can withstand 500° F. for 5 minutes time is produced by the following method. A round piece of 0.2 mm (0.008") thick metal (Kovar) is cut to size of about 25 mm diameter. A 0.2 mm thick piece of piezoceramic material according to Example 1 above is cut into round disks with silver plated electrodes. The mating surfaces of both the metal and ceramic electrode are abraded by bead blasting (or, alternatively, with sand paper, emery cloth, etc.). The metal and the ceramic surfaces are cleaned in an ultrasonic cleaner with appropriate solvents (e.g., methanol and/or IPA). An appropriate chemical bonding promoter (epoxy-Novalac) is applied to both the metal surface and the prepared ceramic-electrode surface. A small drop of epoxy is dispensed to the center of the metal. A grit (tungsten, silicon carbide, etc) of the appropriate size (0.002″) is sprayed into the epoxy to set the bonding line thickness. The ceramic is lowered onto the epoxy/grit drop. The device is clamped with a clamp of the appropriate size (20 lbs.) with a uniform pressure across the crystal. The epoxy is heat-cured according the manufacturer's instructions. The device may also optionally be treated with an appropriate post-cure of over 500° F. if desired. The assembly is pre-heated with a hot plate to 200° F. and Teflon coated wire is soldered to the metal and to the electroded surface of the ceramic with a high temperature (588° F.) solder.

The transducers will typically attenuate upwards of 13 decibels at elevated temperatures of 500° F., relative to a room temperature bench measurement. They are able to survive many cycles of heating to a temperature of 500° F. without further degradation. In contrast, brass buzzers that have been modified with high melting temperature solder degrade quickly at temperature, beyond 30 decibels and do not recover to the original sound level at room temperature.

While the invention has been illustrated and described in detail in the drawings and foregoing description, the same are to be considered as illustrative and not restrictive in character, it being understood that only certain preferred embodiments have been shown and described, and that all changes and modifications that come within the spirit of the invention are desired to be protected.

What is claimed is:

1. A piezoelectric buzzer effective for use in a personal assist safety system (PASS), comprising:
   a) a vibration layer;
   b) a piezoelectric material at least partially overlaying said vibration layer in a manner effective for causing said vibration layer to vibrate to emit a buzzing sound when an electric current is applied to the piezoelectric material; and
   c) electric contacts effective for connecting the piezoelectric layer to an electric power source;
   wherein said piezoelectric material is a material having a base formula of:

$Pb_xSr_{(1-x)}(Mn_{1/3}Sb_{2/3})_{(1-y)}(Zr_zTi_{1-z})_yO_3$ wherein x may range from 0.95 to 0.99;
   wherein y may range from 0.92 to 0.97; and
   wherein z may range from 0.45 to 0.55
   wherein said piezoelectric material includes one or more dopants added by incorporating into the pre-fired composition one or more dopant precursor materials selected from the group consisting of: $CeO_2$, CuO, and $Nb_2O_5$.

2. A piezoelectric buzzer according to claim 1 wherein the dopant precursor materials are preferably added to the ceramic composition in individual amounts ranging from 0.01 wt % to up to 5.0 wt %.

3. A piezoelectric buzzer according to claim 1 wherein the piezoelectric material is a PZT ceramic made from the following relative amounts of starting materials:

$PbO_{0.96}SrO_{0.0194}MnO_{0.016}SbO_{0.032}ZrO_{0.466}TiO_{0.456}$-$NbO_{0.038}CuO_{0.010}CeO_{0.004}$.

4. A piezoelectric buzzer according to claim 1 wherein said vibration layer is made of a material capable of withstanding temperatures in excess of 260° C. for at least five minutes while still maintaining its ability to vibrate and produce a buzzing sound at a level of at least 95 dB (measured at 10 feet from the source; re 20 μPa) when used in a PASS unit.

5. A piezoelectric buzzer according to claim 1 wherein the vibrating material is an iron-nickel-cobalt alloy with a coefficient of linear thermal expansion of $5.15 \times 10^{-6}$/° C. under 260° C.

6. A piezoelectric buzzer according to claim 1 wherein the vibrating material is an iron-nickel alloy with a coefficient of linear thermal expansion of between about $1.5 \times 10^{-6}$/° C. and $2.0 \times 10^{-6}$/° C. under 260° C.

7. A piezoelectric buzzer according to claim 1 wherein the vibrating material is an austenitic nickel-based superalloy having a coefficient of linear thermal expansion of about $7 \times 10^{-6}$/° C. under 260° C.

8. A piezoelectric buzzer according to claim 1 wherein the vibrating material is a molybdenum-based material having a coefficient of linear thermal expansion of about $5.5 \times 10^{-6}$/° C. under 260° C.

9. A piezoelectric buzzer according to claim 1 wherein the vibrating material is a high temperature plastic.

10. A piezoelectric buzzer according to claim 1 wherein the vibrating material is a fiber reinforced plastic.

11. A piezoelectric buzzer according to claim 1 wherein the buzzer includes at least two layers of piezoelectric material.

12. A piezoelectric buzzer according to claim 1 wherein said vibration layer is made of a material capable of withstanding temperatures in excess of 260° C. for at least five minutes while still maintaining its ability to vibrate and produce a buzzing sound at a level of at least 80 dB (measured at 10 feet from the source; re 20 μPa) when used in a PASS unit.

13. A piezoelectric buzzer according to claim 12 wherein the piezoelectric material is a PZT ceramic made from the following relative amounts of starting materials:

$PbO_{0.96}SrO_{0.0194}MnO_{0.016}SbO_{0.032}ZrO_{0.466}TiO_{0.456}$-$NbO_{0.038}CuO_{0.010}CeO_{0.004}$.

* * * * *